US006678432B2

(12) United States Patent
Shigeta et al.

(10) Patent No.: US 6,678,432 B2
(45) Date of Patent: Jan. 13, 2004

(54) OPTICAL INTEGRATED DEVICE, SEMICONDUCTOR LASER MODULE AND OPTICAL TRANSMITTER

(75) Inventors: Junji Shigeta, Fuchu (JP); Kimio Tatsuno, Tokyo (JP); Masataka Shirai, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 76 days.

(21) Appl. No.: 09/785,451

(22) Filed: Feb. 20, 2001

(65) Prior Publication Data

US 2002/0064333 A1 May 30, 2002

(30) Foreign Application Priority Data

Nov. 30, 2000 (JP) ...................................... 2000-365916

(51) Int. Cl.[7] ................................................. G02B 6/13

(52) U.S. Cl. ............................ 385/14; 385/88; 385/49; 372/43; 372/50; 372/38.1; 372/26

(58) Field of Search ........................ 385/14, 49, 88–94; 372/6, 20, 43, 50, 26, 38.1

(56) References Cited

U.S. PATENT DOCUMENTS

| | | | | |
|---|---|---|---|---|
| 4,461,007 A | * | 7/1984 | Burnham et al. | 372/45 |
| 5,070,508 A | * | 12/1991 | Hammer | 372/18 |
| 5,252,513 A | * | 10/1993 | Paoli et al. | 148/DIG. 95 |
| 5,287,376 A | * | 2/1994 | Paoli | 372/43 |
| 5,394,489 A | * | 2/1995 | Koch | 359/115 |
| 5,543,353 A | | 8/1996 | Suzuki et al. | |
| 5,825,792 A | | 10/1998 | Villeneuve et al. | |
| 6,272,157 B1 | * | 8/2001 | Broutin et al. | 372/101 |

FOREIGN PATENT DOCUMENTS

| | | |
|---|---|---|
| JP | 7-50443 | 2/1995 |
| JP | 07050443 | 2/1995 |
| JP | 09129959 | 5/1997 |
| JP | 9-129959 | 5/1997 |
| JP | 10-79723 | 3/1998 |
| JP | 10079723 | 3/1998 |

OTHER PUBLICATIONS

K. Kudo et al., "1.55–μm Wavelength–Selectable Microarray DFB–LD's with Integrated MMI Combiner, SOA, and EA–Modulator", paper TuL5, OFC 2000, 25th Optical Fiber Communication Conference, Mar. 7–10, 2000, Baltimore, published in *OFC 2000 Technical Digest*, pp. 190–192, by Optical Society of America, Washington, DC, 2000.

A. Kasukawa, "High Power Semiconductor Laser for Exciting a Fiber Amplifier", *Kogaku* (*Japanese Journal of Optics*), vol. 29, No. 3, 2000, pp. 148–151, Optical Society of Japan (in Japanese).

(List continued on next page.)

*Primary Examiner*—Hemang Sanghavi
*Assistant Examiner*—Scott Knauss
(74) *Attorney, Agent, or Firm*—Antonelli, Terry, Stout & Kraus, LLP

(57) ABSTRACT

To resolve a problem in which in an optical output and wavelength monitor integrated type semiconductor laser module monolithically integrated in parallel with a plurality of semiconductor lasers, since light emitting positions of the respective semiconductor lasers differ, an allowable range of an optical incident position of the monitor is exceeded, the optical incident position of the monitor is confined in the allowable range by integrating backward optical waveguides for guiding backward beam of the respective semiconductor lasers to a narrow range at a backward end of a semiconductor chip along with the semiconductor lasers, whereby there can be easily realized a semiconductor laser module with a built-in optical monitor even in the case of the chip integrated with the plurality of semiconductor lasers and can be realized an inexpensive optical module having high function.

18 Claims, 12 Drawing Sheets

19 14a 14b 61 15 16 17 18 13 60 a 14d 14c 61 15 1

OTHER PUBLICATIONS

A. Kasukawa, "High power semiconductor laser for exciting a fiber Amplifier", Kogaku (Japanese journal of optics) vol. 19, No. 3 (2000), p148–p151.

K. Kudo et al., "1.55–u m wavelength–Selectable Microarry DFB–LD's with Integrated MMI Combiner, SOA, and EA–Modulator", 25$^{th}$ optical Fiber Communication Conference, TuL5, (2000).

* cited by examiner

OPTICAL INTEGRATED DEVICE, SEMICONDUCTOR LASER MODULE AND OPTICAL TRANSMITTER

BACKGROUND OF THE INVENTION

The present invention relates to an optical integrated device, a semiconductor laser module and an optical transmitter, particularly to a technology effectively applied to a technology for stabilizing output of laser beam radiated from a plurality of semiconductor lasers.

In WDM (Wavelength Division Multiplexing) optical communication, it is very important to adjust and maintain wavelengths of light sources having a plurality of different wavelengths respectively to predetermined wavelengths prescribed by Communication Standards. Therefore, there have been proposed various wavelength adjusting technologies. For example, there is disclosed a technology of controlling a laser oscillation wavelength of a semiconductor laser (laser diode: LD) in Japanese Patent Laid-open (Kokai) No. Hei 9-129959.

There is adopted normally a method of transmitting laser beams emitted from respective semiconductor lasers to a separately packaged wavelength monitoring package by using optical fibers and feeding back control signals in correspondence with deviations from predetermined wavelengths to the respective semiconductor lasers.

According to the method, the apparatus becomes large-sized. In recent years, there has been proposed a method of mounting a small-sized optical output and wavelength monitor using an etalon filter at a vicinity of a position of emitting light of a semiconductor laser chip and including the monitor in a single package to thereby constitute a semiconductor laser module. For example, there is disclosed a wavelength monitor (optical monitor integrated optical transmitter module) for wavelength division multiplexing optical fiber communication in Japanese Patent Laid-open (Kokai) No. Hei 10-79723. According to the apparatus, there is constructed a constitution of arranging DFB (distributed feedback)-LD in a pin package, irradiating laser beam to outside of the package by passing forward beam of the laser diode through a lens, an isolator and a lens and guiding backward beam to a PIN array via Fabri-Perot etalon.

The package, for example, the package in a box shape, is described in A. Kasukawa, "High Power Semiconductor Laser for Exciting a Fiber Amplifier", Kogaku (Japanese Journal of Optics), Vol. 29, No. 3, 2000, pp. 148–151, Optical Society of Japan (in Japanese). According to the literature, there is described a laser module (pig-tail module) projecting a plurality of leads (external electrode terminals) to align from both sides of a box-type package in a shape of a parallelepiped.

Further, according to Japanese Patent Laid-open (Kokai) No. Hei 7-50443, there is described a distributed feedback type laser with a modulator. According to the literature, there is described a selective growth technique as a method of integrating optical semiconductor elements having different kinds of functions such as a semiconductor laser, an optical modulator, an optical switch, an optical detector and an optical amplifier on the same semiconductor substrate.

SUMMARY OF THE INVENTION

According to the conventional optical monitor integrated optical transmitter module, there is constructed a structure integrated to a single package, which is an excellent method for making apparatus small-sized and inexpensive. However, according to the method, a single laser diode is formed on a semiconductor chip (semiconductor laser chip).

In the meantime, in recent years, there has been proposed a chip (semiconductor laser chip) in which in order to emit a plurality of wavelengths of beams in a range at least covering a portion of a plurality of wavelengths prescribed by the wavelength division multiplexing optical fiber communication, not only a laser diode having a predetermined single wavelength but also a plurality of semiconductor lasers (laser diodes) are monolithically integrated on a single semiconductor substrate, further, a multiplexer for multiplexing forward beams of the lasers, an amplifier and a modulator are monolithically integrated (K.Kudo et al., 25th Optical Fiber Communication Conference, TuL5, (2000)).

Hence, the inventors have investigated to combine the above-described integrated semiconductor laser chip with a small-sized optical monitor and integrating thereof to a box-type package, conventionally used. However, according to the method, it is known that the following problem is posed by the method.

FIG. 18 is a simplified schematic view of an integrated laser chip which has been investigated by the inventors prior to the present invention.

A semiconductor chip 1 is monolithically integrated with a plurality of semiconductor lasers 14*a* through 14*d*, forward optical guides 15, a multiplexer 16, an amplifier 17 and a modulator 18. Forward beam 60 of the semiconductor lasers 14*a* through 14*d* is guided to the multiplexer 16 by the forward optical guides 15 and is irradiated from an emitting face a of the semiconductor chip 1 by being successively guided by the amplifier 17 and the modulator 18. Further, wirings, electrode pads and the like are omitted in the drawing (the same as in following views).

When the plurality of semiconductor lasers 14*a* through 14*d* are integrated in the single pitch, in order to avoid interference thereamong, it is necessary to arrange the semiconductor lasers to be remote from each other by a predetermined distance or more. According to the above-described publicly-known example (K.Kudo et al., 25th Optical Fiber Communication Conference, TuL5, (2000)), an area having a width of 80 μm is arranged for arranging 8 pieces of lasers. The range is further increased when a number of integrated lasers is increased.

This signifies that when optical intensities of the respective semiconductor lasers 14*a* through 14*d* are monitored, a backward radiation range L becomes large. According to the example of FIG. 18, L becomes about 40 μm. For an optical monitor element constituted by an optical receiving element, it is necessary that an incident position and an incident direction of beam fall within predetermined ranges. The range is about 10 and several μm although depending on the style of the optical monitor. Therefore, when a number of integrating semiconductor lasers becomes large, even in the case of arranging the semiconductor chip land an optical monitor element contiguously to each other, there poses a problem that the range of a position of emitting beam of the respective semiconductor laser exceeds a detectable area (area) of the optical monitor element.

The integrated laser chip (semiconductor chip) 1 is constructed by the constitution of multiplexing, amplifying and modulating forward beam irradiated from the respective semiconductor lasers 14*a* through 14*d* and emitting thereof from the extremely small area a at the front end of the chip. Hence, there is conceivable a method of constructing a constitution of dividing a portion of the forward beam and monitoring the forward beam by transmitting the forward beam to an optical monitor without adopting a method of monitoring backward beam. According to the method, although there can be avoided the problem of nonuniformity of monitor accuracy caused by a variation in a position of emitting beam by the respective semiconductor laser, there poses a problem that beam to be used for transmission is attenuated by the monitor. Further, according to the method, there also poses a problem that output of the semiconductor laser cannot be monitored directly since the output of the respective semiconductor laser is monitored through the amplifier.

It is an object of the present invention to provide an optical integrated device, a semiconductor laser module and an optical transmitter capable of highly accurately monitoring output beam of respective semiconductor lasers subjected to laser-array monolithic integration on a semiconductor substrate.

It is other object of the present invention to provide an optical integrated device for emitting backward beam of respective semiconductor lasers subjected to laser-array monolithic integration on a semiconductor substrate from an extremely small area at a backward end of a semiconductor substrate (semiconductor chip).

A simple explanation will be given of an outline of a representative aspect in the present invention disclosed in the application as follows.

Semiconductor optical waveguides (forward optical guides, backward optical guides) for guiding backward beam of respective semiconductor lasers monolithically integrated to a semiconductor substrate to ends of the semiconductor substrate (semiconductor chip ends: forward end and backward end), are integrated to a chip the same as that of the semiconductor lasers, and the respective optical guides are made proximate to each other or bundled by a multiplexer and a range of a position of emitting beam is confined in a detectable area of a used optical monitor to thereby resolve the problem. Different from the semiconductor lasers, relative positions of the optical waveguides can be made proximate to each other or can be multiplexed by the multiplexer. Accordingly, the position of emitting beam can be confined in a predetermined range.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

A detailed explanation will be given of embodiments of the present invention in reference to the drawings as follows. Further, in all of the drawings for explaining the embodiments of the present invention, portions having the same functions are attached with the same notations and repetitive explanation thereof will be omitted.

(Embodiment 1)

FIG. 1 through FIG. 9 are drawings according to an embodiment (Embodiment 1) of the present invention. The embodiment 1, an explanation will be given of an example in which the present invention is applied to wavelengths multiplexing optical communication.

Figure 1:
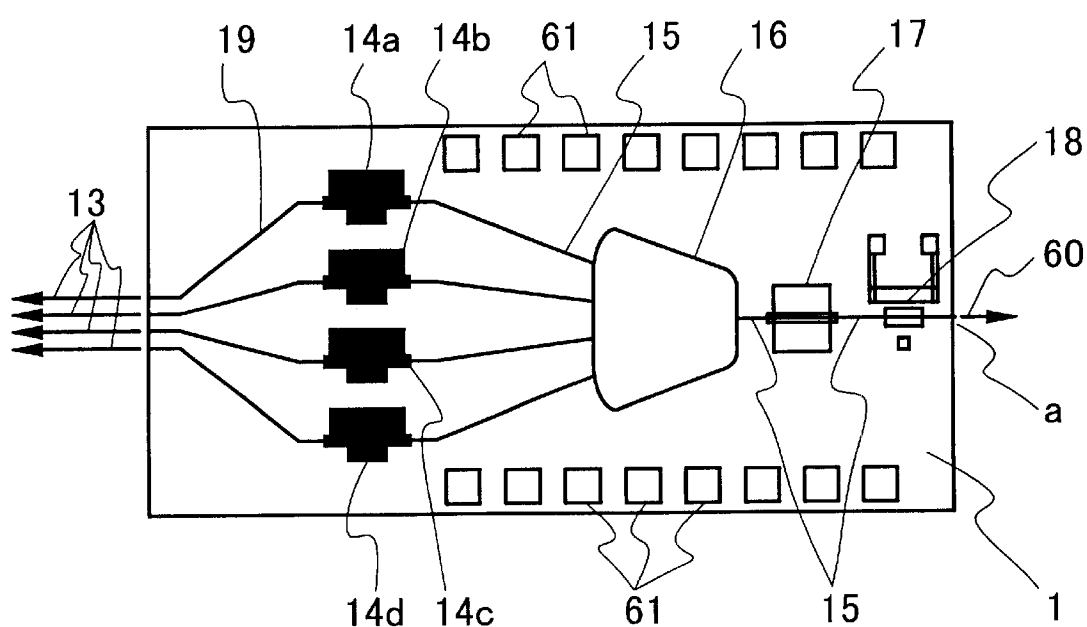
FIG. 1 is a schematic plane view of an optical integrated device according to an embodiment (Embodiment 1) of the present invention.

FIG. 1 is a schematic plane view of an optical integrated device (integrated semiconductor laser chip) according to Embodiment 1 of the present invention, showing an example in which a plurality of pieces, for example, four pieces of laser diodes (semiconductor lasers) are monolithically integrated on a semiconductor substrate (semiconductor chip). At a surface (main face) portion of the semiconductor chip 1, there are provided the plurality of semiconductor lasers **14*a* through 14*d* in parallel and forward beam 60 and backward beam 13 of the semiconductor lasers 14*a* through 14*d* are guided up to ends (forward end and backward end) of the semiconductor substrate (semiconductor chip 1) by forward optical waveguides 15 and backward optical waveguides 19 monolithically formed at the semiconductor substrate. The forward optical waveguides 15 and the backward optical waveguides 19** are highly accurately formed in a monolithic state by photolithography technology.

The backward optical waveguides 19 are arranged to be proximate to each other at the backward end of the semiconductor chip 1. This is for making the respective backward optical waveguides 19 enter a light receiving area of an optical monitor element (photo detector). That is, at the backward end of the semiconductor chip 1, an interval between contiguous ones of the four backward optical waveguides 19 is set to 1.5 μm. An optical waveguide width of the backward optical waveguide 19 is 2 μm and accordingly, a distance between end to end of the backward optical waveguides 19 at both ends becomes 12.5 μm (refer to FIG. 6). A number of the waveguides can be formed in a range as narrow as about 10 and several μm can be formed by using fine photolithography technology.

In the midst of the forward optical waveguides 15 for guiding forward beam, there are monolithically arranged the multiplexer 16, the amplifier 17 and the modulator 18 and a single piece of the forward beam 60 is emitted from the front end of the semiconductor chip 1. That is, the forward beam of four pieces of the semiconductor lasers 14*a* through 14*d* is respectively guided to the multiplexer 16 by the forward optical waveguides 15. The respective pieces of the forward beam are multiplexed by the multiplexer 16 and outputted to a single piece of the forward optical waveguide 15. The single piece of the forward optical waveguide 15 guides forward beam to the amplifier 17. Forward beam amplified by the amplifier 17 is guided to the multiplexer 18 through a single piece of the forward optical waveguide 15. The forward beam 60 modulated by the modulator 18 is outputted from the forward end of the semiconductor chip 1. The forward beam 60 is emitted from the very small area a at the forward end of the semiconductor chip 1.

Further, although it is described that the semiconductor lasers 14*a* through 14*d* and optical parts of the multiplexer 16, the amplifier 17 and the modulator 18 are optically connected, actually, the respective optical parts are connected by the optical waveguides formed monolithically at the semiconductor substrate and having no interruption and optical connection is not carried out particularly as operation.

The semiconductor chip 1 is provided with wirings, not illustrated, and electrodes 61 connected to the wirings. The electrodes 61 are provided along edges of the semiconductor chip 1 and constitute pads for connecting conductive wires.

The plurality of semiconductor lasers are designed and fabricated to oscillate beam having a wavelength covering at least a portion of a plurality of wavelengths (referred to as grids) determined by a communication system and provided with a function capable of selecting and transmitting one of the grids determined by the communication system by selecting and oscillating any one of the semiconductor lasers.

Figure 2:
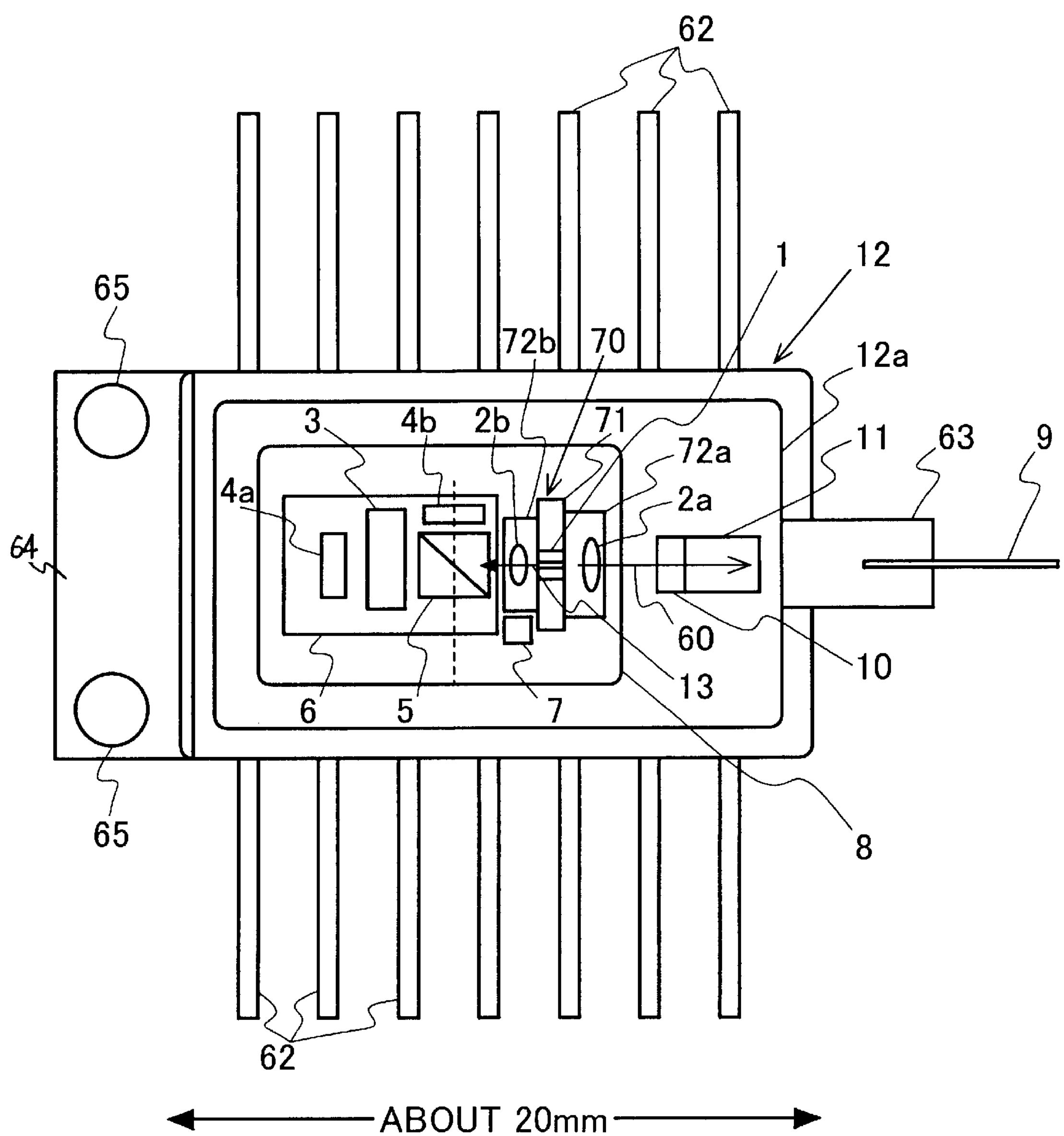
FIG. 2 is a schematic plane view of a semiconductor laser module of Embodiment 1.

FIG. 2 is a schematic plane view showing an outline of a semiconductor laser module integrated with the semiconductor chip 1. Further, as is well known, generally, a semiconductor laser (Fabri-Perot type semiconductor laser) is provided with two faces of emitting beam. Therefore, in the specification, emitting beam emitted from a main emitting face (forward end) used for transmission of information is referred to as forward beam and emitting beam emitted from an emitting face opposed thereto (backward end) is referred to as backward beam.

As shown by FIG. 2, a semiconductor laser module is constructed by a structure of projecting a plurality of leads 62 constituting external electrode terminals from both sides of a package 12 in a shape of a box and is constructed by a structure of attaching one end side of an optical fiber 9 (optical fiber cable) to a fiber guide 63 attached to one end of the package 12. Further, other end side of the package 12 is provided with a flange 64. The flange 64 is provided with two of attaching holes 65. By utilizing the attaching holes 65, the semiconductor laser module is fixed to a predetermined substrate. The package 12 comprises a package main body 12*a* in a shape of a box an upper portion of which is opened and a cap, not illustrated, for closing the package main body 12*a*. Although not particularly limited, the box shape portion of the package main body 12*a* (cap) is as small as, for example, about 10 mm in width and about 20 mm in length.

A Pertier cooler 8 is fixed to an inner bottom face of the package main body 12*a*. Further, a mount block 70 and a subassembly substrate 6 formed by a wiring board are fixed on the Pertier cooler 8. The mount block 70 is provided with a mounting portion 71 and lens fixing portions 72*a* and 72*b* disposed at both end sides of the mounting portion 71. The mounting portion 71 is mounted with the semiconductor chip 1.

Further, the lens fixing portion 72*a* is attached with a collimator lens 2*a* for constituting parallel beam from the forward beam 60 emitted from the semiconductor chip 1 and the lens fixing portion 72*b* is attached with a collimator lens 2*b* for constituting parallel beam from the backward beam 13. The forward beam 60 which has transmitted through the collimator lens 2*a*, passes through an optical isolator 10 and a condenser lens 11 fixed to the inner bottom face of the package main body 12*a*, advances to a front end face of the optical fiber 9 and is taken into the optical fiber 9.

The subassembly substrate 6 is fixed with a beam splitter 5 for splitting the backward beam 13 which has transmitted through the collimator lens 2*b* in a straight direction or a direction of reflecting by 90 degrees. A backward optical component which advances in the straight direction, reaches a photo detector 4*a* by passing through an etalon filter 3. A backward optical component which advances in the direction of reflecting by 90 degree, reaches a photo detector 4*b*. The etalon filter 3 and the photo detectors 4*a* and 4*b* are also fixed on the subassembly substrate 6. In this case, the etalon filter 3 is a Fabri-Perot etalon and is constituted by, for example, a filter produced by depositing a high-reflective film at both end faces of a cylindrical glass body.

Further, at a position on the Pertier element 8 proximate to the semiconductor chip 1, there is provided a thermistor 7 for detecting temperature.

Further, although not illustrated, respective electrodes of respective optical elements applied with voltage and inner end portions of the leads 62 projected to the inner side of the package main body 12*a* in the box shape, are electrically connected by conductive wires. Therefore, by applying predetermined voltage to the respective leads 62, active parts starting from the semiconductor chip 1 can be controlled to drive and detected current at the photo detectors 4*a* and 4*b* can be provided through the leads 62.

Figure 5:
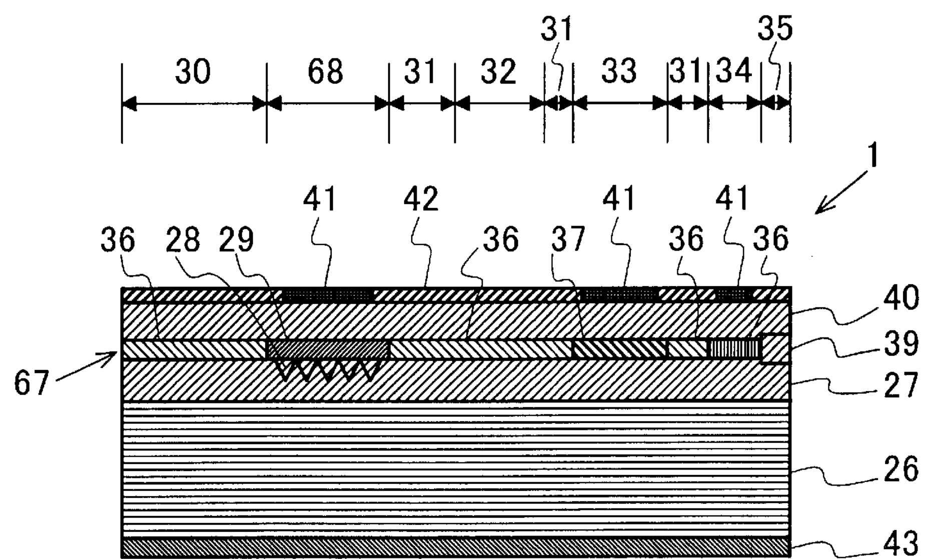
FIG. 5 is a schematic sectional view of the optical integrated device of Embodiment 1.
Figure 6:
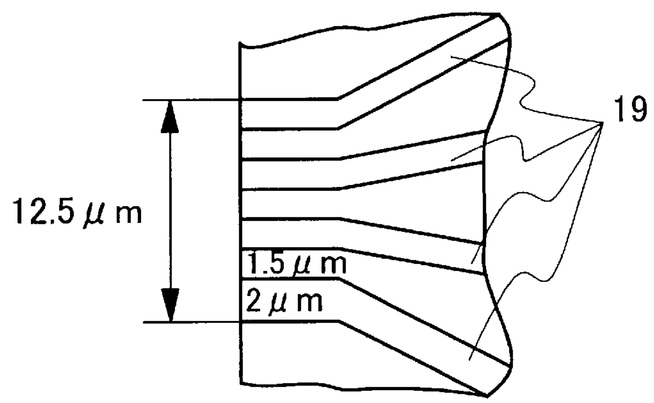
FIG. 6 is an enlarged schematic view showing backward optical waveguides of the optical integrated device of Embodiment 1.

Here, an explanation will be given of a structure of the semiconductor chip 1 including a method of fabricating thereof in reference to FIG. 5. FIG. 5 is a simplified schematic sectional view of an integrated semiconductor laser chip. The section is shown along one of a plurality of paths along which beam advances and is not shown by the sectional view cut along a straight line.

In fabricating the semiconductor chip 1, various semiconductor layers necessary for semiconductor optical elements integrated on the chip are fabricated by pertinently selecting materials of InP, InGaAsP and InGaA1As. First, a semiconductor substrate 26 of a first conductive type, for example, an InP substrate 26 is prepared and an epitaxial layer is formed on the surface (mainface) by an ordinary method. That is, a lower cladding layer 27 comprising the first conductive type (n-InGaAsP layer) is formed on the semiconductor substrate 26, thereafter, a diffraction grating 28 is formed on the surface of the loser cladding layer 27 in correspondence with the laser diode portion.

Next, a multiple quantum-well layer 67 is provided over an entire area of an upper face of the lower cladding layer 27 and is patterned to thereby form the optical waveguides. As shown by FIG. 5, the multiple quantum-well layer 67 constituting the optical waveguides are formed with, from left to right, a backward optical waveguide region 30, a laser diode region 68, a forward optical waveguide region 31, a multiplexer region 32, a forward optical waveguide region 31, an amplifier region 33, a modulator region 34 and a window region 35 and the respective regions are constructed by structures in correspondence therewith.

That is, the backward optical waveguide region 30 constitutes a semiconductor layer 36 for waveguides for forming four pieces of backward optical waveguides 19. The layer diode region 68 constitutes a semiconductor layer 29 for laser for forming oscillators of four pieces of the semiconductor lasers 14*a* through 14*d*. The forward optical waveguide region 31 and the multiplexer region 32 constitute the semiconductor layer 36 for waveguides. The amplifier region 33 constitutes a semiconductor layer 37 for amplifier, the modulator region 34 constitutes a semiconductor layer 38 for modulator and the window region 35 constitutes a semiconductor layer 39 for window.

Further, the semiconductor lasers 14*a* through 14*d* are provided with structures having different oscillation wavelengths as necessary. Although the oscillation wavelength is changed by temperature, it is well known that in order to change the wavelength at constant temperature, widths of the optical waveguides, a thickness of the multiple quantum-well layer 67 and the pitch of the diffraction grating 28 may be designed and fabricated into optimum values in accordance with wavelengths. Compositions of the semiconductor layers at the backward optical waveguides and the multiplexer are the same. Further, compositions of the semiconductor layer 39 for window and the lower cladding layer 27 are the same.

Next, both sides of the multiple quantum-well layer 67 and the respective optical waveguide regions, are formed with semi-insulating InP layers (not illustrated) doped with Fe for serving to carry out optical confinement on both sides of the waveguides and prevent drive current from flowing to other than necessary regions.

Next, at an entire area on the side of the main face of the semiconductor chip 1, there is provided an upper cladding layer 40 of a second conductive type (P-InGaAsP).

On the upper side cladding layer 40, there is selectively provided a passivation film 42 comprising an $SiO_2$ film. Further, electrodes are respectively provided at portions where semiconductor layers are exposed. That is, electrodes 41 are provided at the laser diode region 68, the amplifier region 33 and the modulator region 34. Further, at the rear face of the semiconductor substrate 26, there is provided a common electrode 43. Thereby, the semiconductor chip 1 is finished.

Further, actually, there are formed portions constituting semiconductor chips (semiconductor element) longitudinally and transversely in a semiconductor substrate (wafer) having a large area and the semiconductor chips are formed by cleaving and separation.

According to the semiconductor ship 1, by applying predetermined voltage between the electrode 41 of the laser diode region 68 and the electrode 43, laser beam is emitted from the semiconductor lasers 14*a* through 14*d*. In this case, by selecting one of the electrodes 41, any semiconductor laser of the semiconductor lasers 14*a* through 14*d* can be driven.

Further, by applying predetermined voltage between the electrode 41 of the amplifier region 33 and the electrode 43, the amplifier 17 can be driven. Similarly, by applying predetermined voltage between the electrode 41 of the modulator region 34 and the electrode 43, the modulator 18 can be driven and transmission can be carried out.

Further, in fabricating the semiconductor chip 1, since well-known lithography technology is used in forming selective growth mask for determining the respective regions, fine positioning and fabrication are possible and a number of the backward optical guides can be formed in a narrow area at the end of the chip.

As has been described, according to Embodiment 1, there can be realized the semiconductor laser module incorporating the optical monitor elements (photo detectors) by integrating the plurality of pieces of laser diodes and the backward optical guides and confining the position of emitting the backward beam within allowable ranges of the positions of the optical monitor elements. There are conceivable various systems of the optical monitor portions and various number and kind of elements to be integrated to the semiconductor chip.

Figure 3:
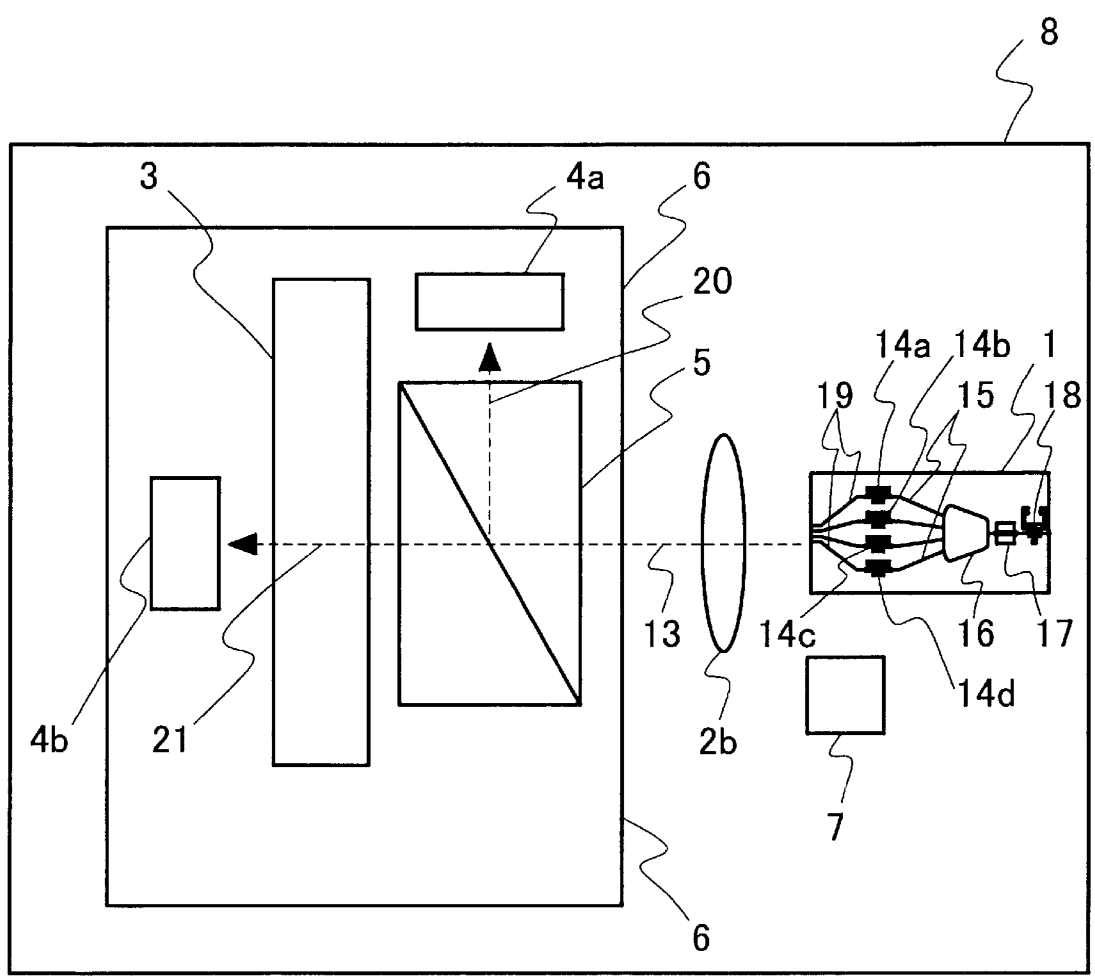
FIG. 3 is a schematic plane view showing a portion of the semiconductor laser module of Embodiment 1.

FIG. 3 is a schematic plane view showing a portion of the semiconductor laser module. The drawing is a view showing the Pertier element 8 mounted with the subassembly substrate 6, the semiconductor chip 1, the collimator lens 2*b* and the thermistor 7.

Any type can be used for the optical monitor portion (optical monitor system), so far as the optical monitor portion can be provided in a small-sized package as shown by FIG. 2 and detect beam of a plurality of grid wavelengths in correspondence with the respective semiconductor lasers 14*a* through 14*d*. According to Embodiment 1, the optical monitor system is constituted by the collimator lens 2*b* for constituting parallel ray from the backward beam 13, the beam splitter 5, the etalon filter 3 and the optical detectors 4*a* and 4*b*.

According to the constitution, the backward beam of the semiconductor laser which is selected and oscillated, is emitted from any position within the allowable range at the backward end of the semiconductor chip 1 and is incident on the beam splitter 5 after having been shaped by the collimator lens 2*b*. Further, a portion of reflected beam 20 is bent in right angle and is incident on the photo detector 4*a*. Further, other portion of beam transmits through the beam splitter 5 and the etalon filter 3 (transmitted beam 21) and is incident on the photo detector 4*b*.

Figure 7:
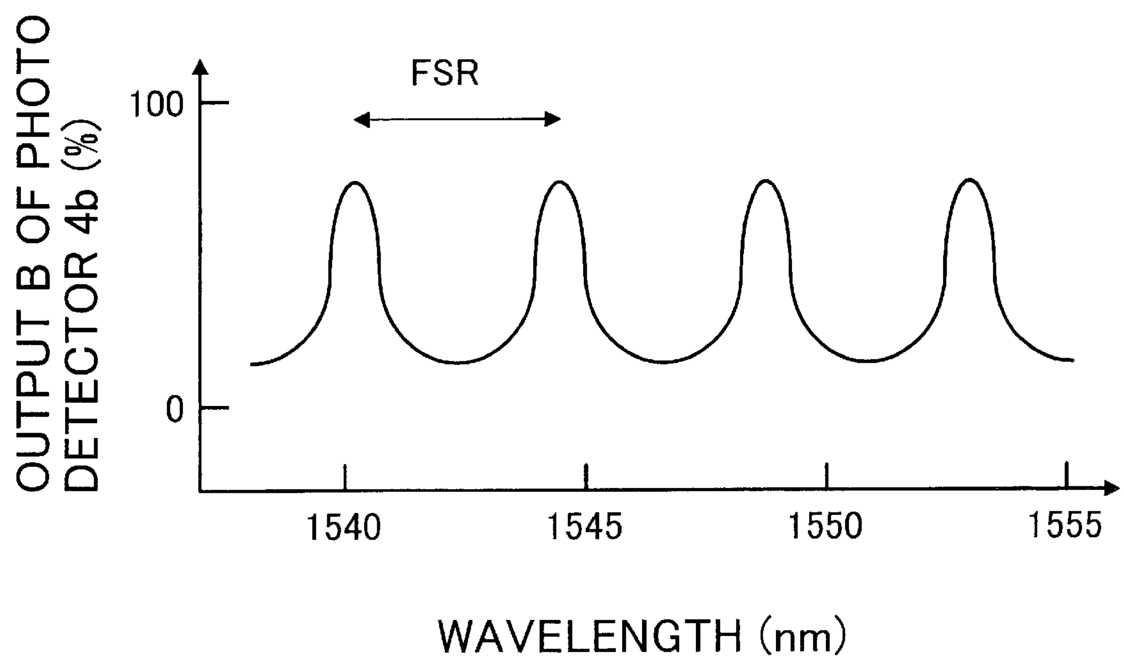
FIG. 7 is a characteristic diagram showing a correlation between an output B and a wavelength of photo detector **4*b*** in the semiconductor laser module of Embodiment 1.

The etalon filter is an optical element coated with reflecting films having pertinent reflectivity on both faces of transparent glass plate and it is known that an optical transmission amount of incident beam is periodically changed as a result of multiple reflection and interference between the reflecting films. That is, an output B of the photo detector 4*b* is provided with a plurality of similar peaks as shown by FIG. 7 in accordance with the wavelength of the incident beam. The position and the interval (FSR) of the peak are determined by a thickness and the refractive index of glass constituting etalon.

Figure 8:
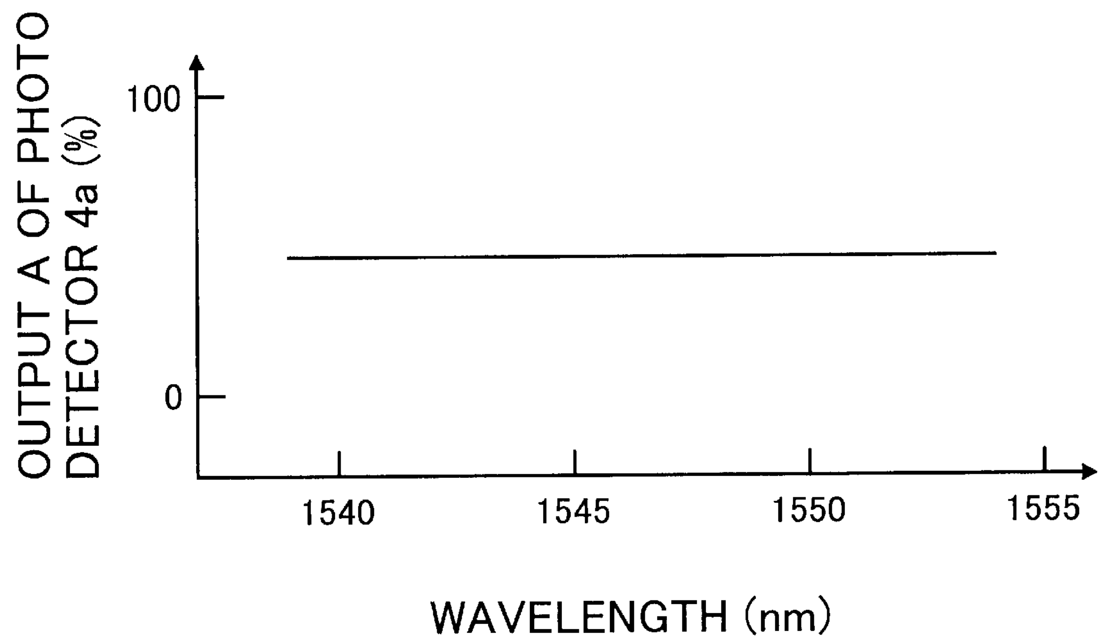
FIG. 8 is a characteristic diagram showing a correlation between an output A and a wavelength of a photo detector **4*a*** in the semiconductor module of Embodiment 1.

In the meantime, an optical amount of the reflected beam 20 bent by the beam splitter 5 is not changed by the wavelength and accordingly, an output A of the photo detector 4*a* becomes constant relative to the wavelength as shown by FIG. 8.

Figure 9:
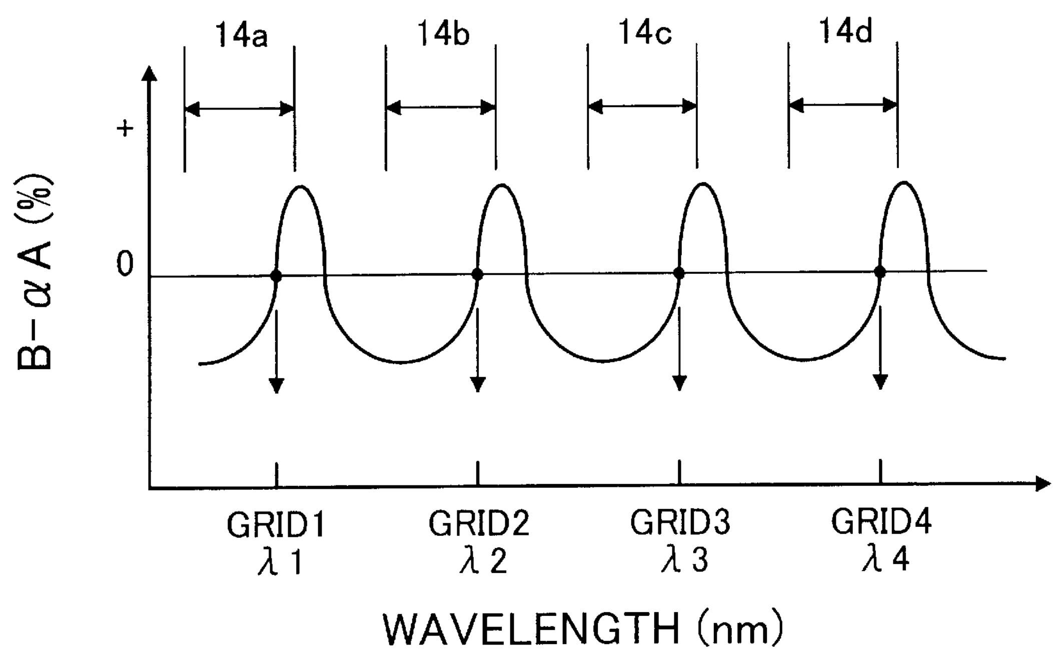
FIG. 9 is a characteristic diagram showing a correlation between a difference (B-$\alpha$A) between the output B of the photo detector **4*b* and the output A of the photo detector 4*a*** and the wavelength.

Hence, when a difference therebetween B-αA(%) is calculated by selecting pertinent coefficient α, as a result, there can be constituted a curve passing through several 0 points as shown in FIG. 9. Further, by pertinently designing etalon and selecting α wavelengths of a set of the respective 0 points can be made to coincide with grids 1 through 4 (wavelengths λ1 through λ4) prescribed by the communication standards.

Although according to the constitution, transmission characteristics of etalon are changed by the incident direction, at an emission end of the semiconductor chip 1, the transmission characteristics can be designed to be capable of permitting a range of a change in a position of about 15 μm. The value is larger than a range of a change in an emission position of the semiconductor chip 1 according to Embodiment 1 shown in FIG. 1 and therefore, there poses no problem. Although the wavelengths of the respective semiconductor lasers 14*a* through 14*d* are changed by temperature, the semiconductor lasers are fabricated such that the oscillation wavelengths fall respectively in ranges illustrated by FIG. 9 at normal operational temperature.

In this way, for example, in the case of monitoring the wavelength of the semiconductor laser 14*a*, when a result of calculation is positive, the wavelength is controlled to shorten and when the result of calculation is negative, the wavelength is controlled to prolong to thereby control thereof such that the result of calculation always become 0. The semiconductor laser 14*a* is fabricated such that the wavelength falls in the illustrated range of FIG. 9 and accordingly, when the result of calculation is controlled to 0, the oscillation wavelength coincides with the grid 1. According to the optical monitor system constituted in this way, the wavelength control of the respective semiconductor lasers 14*a* through 14*d* is carried out as follows.

Figure 4:
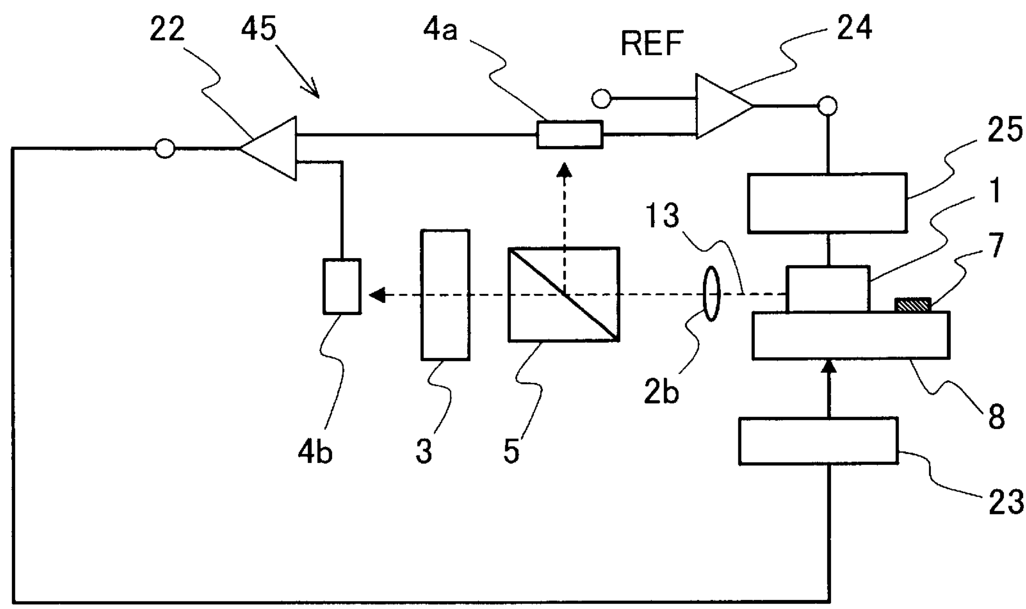
FIG. 4 is a block diagram showing a constitution of a portion of an optical transmitter of Embodiment 1.

FIG. 4 is a block diagram showing a constitution of a portion of an optical transmitter according to Embodiment 1. An optical monitor 45 is shown in the drawing. Now, assume that the semiconductor layer 14*a* is selected and oscillated. The output A of the photo detector 4*a* and the output B of the photo detector 4*b* by the backward beam 13, are inputted to a calculator 22, B-αA is calculated, and the result thereof is inputted to a Pertier element controller 23. The Pertier element controller 23 controls to lower temperature of the Pertier element 8 when the result of calculation is positive.

Conversely, when the result of calculation is negative, the temperature is controlled to elevate. Because the oscillation wavelength of the semiconductor laser is prolonged when temperature is elevated and is shortened when temperature is lowered. Further, when the temperature is continued to adjust such that the result of calculation becomes 0, the oscillation wavelength is controlled to the grid 1. When similar operation is carried out with regard to other semiconductor lasers integrated to the semiconductor chip 1, the wavelengths of the other grids can be oscillated.

Temperature of the Pertier element 8 is monitored by the thermistor 7. The photo detector 4*a* is used also for monitoring outputs of the respective semiconductor lasers. In changing the temperature, there may be used a chip provided with a heater at a vicinity of the respective laser diode. Naturally, both may be used. The output A of the photo detector 4*a* is compared with a previously set reference value by a calculator 24 and a laser drive power source 25 controls laser output such that output A becomes equal to the reference value. In this way, laser output of the forward beam 60 is maintained constant.

According to Embodiment 1, the following effects are achieved.

(1) At the backward end of the semiconductor chip 1, the plurality of backward optical waveguides 19 are gathered and arranged within the predetermined range (extremely small area). That is, there is constructed the structure in which all of the backward optical waveguides 19 are disposed within the width range of about 12.5 mm. Although optical parts such as the collimator lens 2*b* are used, the optical parts are provided in the light receiving areas of the photo detectors (optical monitor elements) and highly accurate beam detection can be carried out.

(2) By the above-described (1), there can be provided an optical integrated device, a semiconductor laser module and an optical transmitter capable of highly accurately controlling the optical output of the semiconductor laser.

(3) According to Embodiment 1, the forward beam is amplified by the amplifier 17 and accordingly, there can be provided an optical integrated device, a semiconductor laser module and an optical transmitter capable of highly accurately controlling the optical output of the semiconductor laser with no attenuation.

(Embodiment 2)

Figure 10:
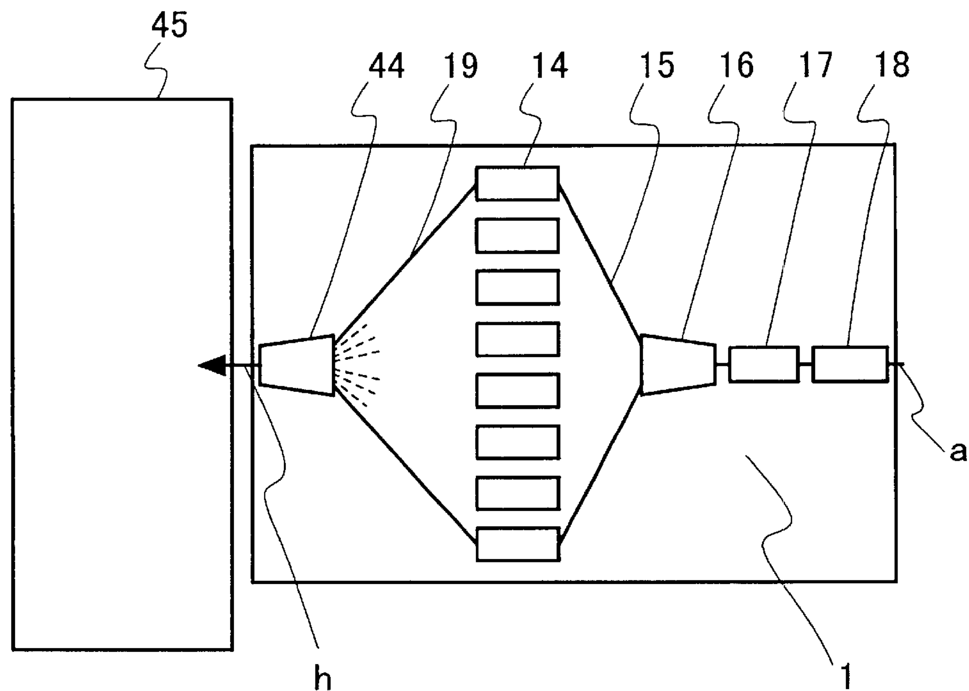
FIG. 10 is a schematic plane view of a semiconductor laser module according to other embodiment (Embodiment 2) of the present invention.

FIG. 10 is a schematic plane view of a semiconductor laser module according to other embodiment (Embodiment 2) of the present invention. In FIG. 10, the semiconductor chip 1 is schematically drawn and the optical monitor 45 contiguous thereto is shown as a block. This stays the same also in other embodiments, mentioned later.

According to Embodiment 2, the semiconductor chip 1 is further formed with a backward beam multiplexer 44 monolithically and the plurality of pieces of backward optical waveguides 19 are integrated to a single piece of backward optical guide.

When a number of integrated laser diodes is increased (in FIG. 10, the example of 8 pieces is shown), a number of pieces of backward optical waveguides are constituted and a variation in the emission position is increased by the constitution shown by FIG. 1 according to Embodiment 1.

Hence, as shown by FIG. 10, by bundling the number of backward optical waveguides 19 by integrating the backward beam multiplexer 44, an emission position b of the backward beam 13 at the backward end of the semiconductor chip 1 becomes an extremely small area (one point) and the emission position range becomes narrower than that of Embodiment 1 and accordingly, design and assembly accuracy of the backward optical monitor can be alleviated.

(Embodiment 3)

Figure 11:
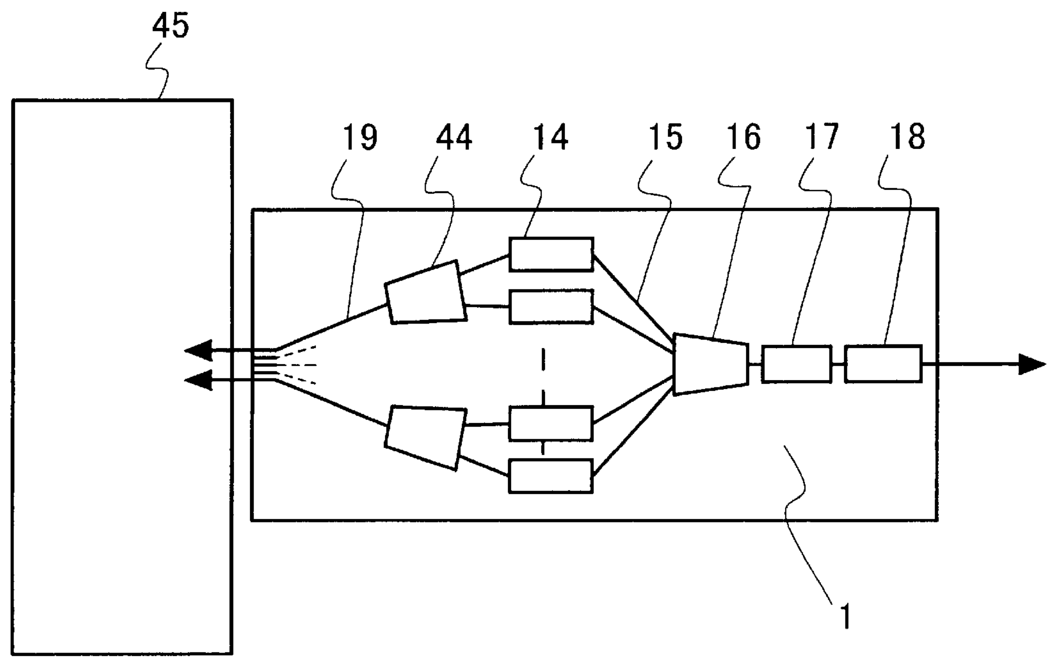
FIG. 11 is a schematic plane view of a semiconductor laser module according to other embodiment (Embodiment 3) of the present invention.

FIG. 11 is a schematic plane view of a semiconductor laser module according to other embodiment (Embodiment 3) of the present invention. The embodiment is a preferable example in the case in which the number of semiconductor lasers is further increased. When the backward beam is bundled by using the backward beam multiplexer 44, there poses a problem in which the optical output is reduced in accordance with a number of bundling.

In order to maintain the number of bundles of multiplexed backward beam to be small to avoid the problem, a plurality of the backward beam multiplexers 44 are arranged, a plurality of the backward optical waveguides 19 of the semiconductor laser are multiplexed by a single piece of the backward beam multiplexer 44 and the backward optical waveguides 19 on the output sides of the respective backward beam multiplexers 44 are densely aligned on the backward end of the semiconductor chip 1 as in the example of Embodiment 1.

The number of pieces to be bundled and the number of the emission positions are determined in accordance with the incident position allowable range and the sensitivity of the optical monitor 45.

(Embodiment 4)

Figure 12:
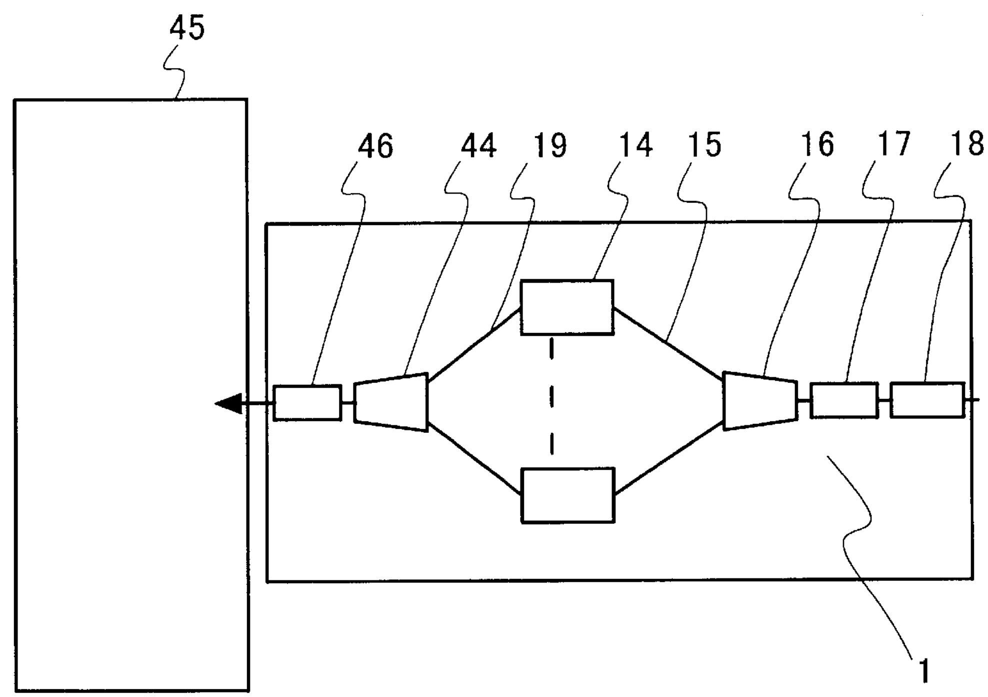
FIG. 12 is a schematic plane view of a semiconductor laser module according to other embodiment (Embodiment 4) of the present invention.

FIG. 12 is a schematic plane view of a semiconductor laser module according to other embodiment (Embodiment 4) of the present invention. Embodiment 4 is an example of monolithically integrating a semiconductor amplifier 46 for backward beam.

The backward beam multiplexer 44 causes a reduction in output. Hence, according to Embodiment 4, the reduction in output by the backward beam multiplexer 44 can be complemented by the semiconductor optical amplifier 46 for backward beam. Therefore, by adopting Embodiment 4, a larger number of the backward optical waveguides 19 can be bundled and the emission position of the backward beam at the backward end of the semiconductor chip 1 can be made an extremely small area (one point).

According to Embodiment 4, similar to the case of Embodiment 2 shown in FIG. 10, design and assembly accuracy of the optical monitor 45 can be alleviated.

(Embodiment 5)

Figure 13:
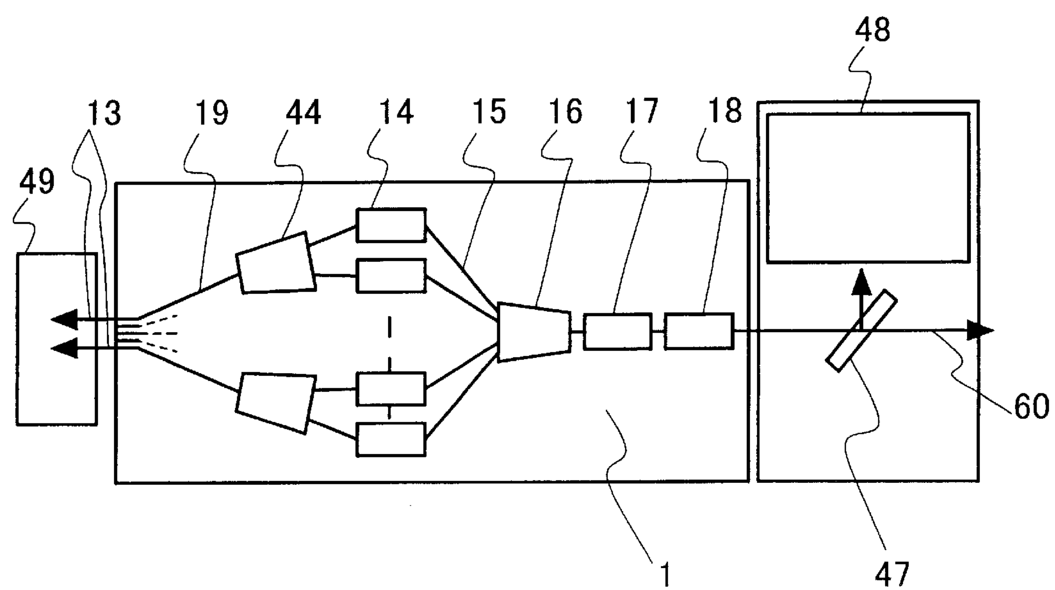
FIG. 13 is a schematic plane view of a semiconductor laser module according to other embodiment (Embodiment 5) of the present invention.

FIG. 13 is a schematic plane view of a semiconductor laser module according to other embodiment (Embodiment 5) of the present invention. Embodiment 5 is an example in which optical monitors are mounted forward and backward from the semiconductor chip 1. The wavelength and the optical output are monitored at the forward optical monitor and at the backward optical monitor, only the optical output is monitored.

In FIG. 13, the forward beam irradiated from the respective semiconductor lasers 14 is guided by the forward optical waveguides 15, passes through the multiplexer 16, amplified by the amplifier 17 and thereafter modulated by the modulator 18. The forward beam 60 is split by the beam splitter 47 and split beam is guided to a forward optical monitor 48. Further, the backward beam 13 is guided to a backward beam output monitor 49 without passing through an amplifier.

According to the constitution, since the backward optical waveguide 19 is not provided with an optical amplifier, at the backward beam output monitor 49, output of the semiconductor lasers 14 can be monitored directly. Further, at the forward optical monitor 48, there can be monitored output determined by both of the semiconductor laser output and an amplification rate of the amplifier 17. By comparing the forward and backward outputs, the output of the semiconductor lasers 14 and the amplification rate of the amplifier 17 can respectively be monitored. Although the wavelength may be monitored by either of the forward and backward monitors, since the incident position allowable range is widened in the case of detecting only the output, design and assembly accuracy can be alleviated by monitoring only the output from the backward beam output monitor 49. Although according to FIG. 13, there is shown the example of using the semiconductor chip shown in FIG. 11 according to Embodiment 3, the semiconductor chip shown in FIG. 1 or FIG. 10 may naturally be used.

(Embodiment 6)

Figure 14:
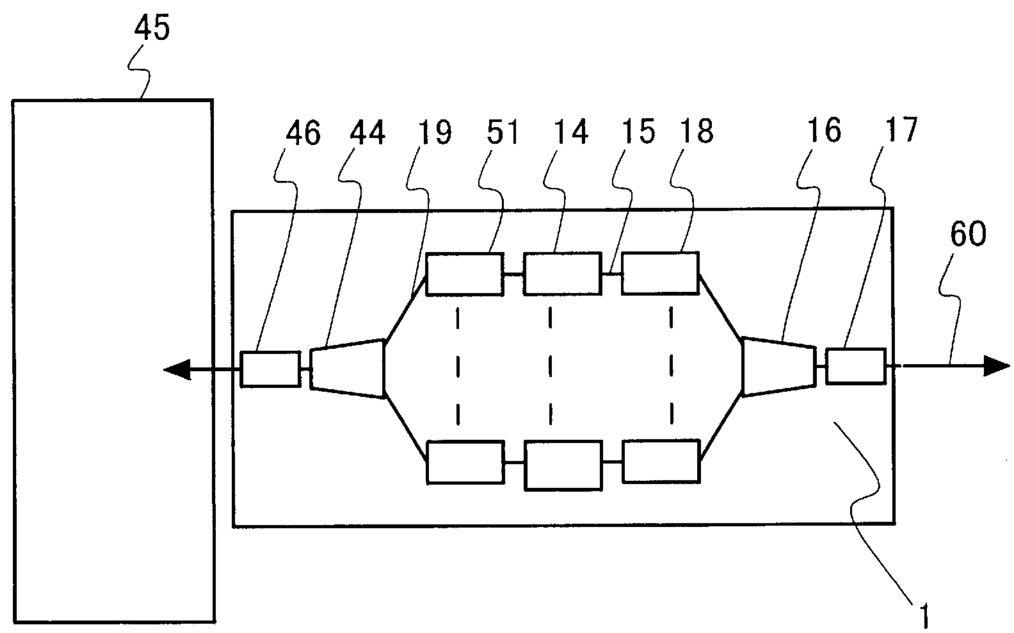
FIG. 14 is a schematic plane view of an optical transmitter according to other embodiment (Embodiment 6) of the present invention.

FIG. 14 is a schematic plane view of a semiconductor laser module according to other embodiment (Embodiment 6) of the present invention. According to Embodiment 6, there is constructed a constitution in which the semiconductor chip 1 is arranged in parallel with the plurality of semiconductor lasers 14 and the respective semiconductor lasers 14 are modulated by the respective modulators 18. The modulated respective forward beam is multiplexed by the multiplexer 16 and thereafter amplified by the amplifier 17 and radiated as the single piece of forward beam 60.

Therefore, a modulated signal can be superposed on the laser beam radiated from the respective semiconductor laser. Therefore, by simultaneously operating the plurality of semiconductor lasers having different wavelengths, the forward beam 60 can be transmitted while including wavelength multiplexing signals.

According to Embodiment 6, as shown by the drawing, a plurality of optical gates are integrated on the backward beam side of the semiconductor chip 1 and the semiconductor chip 1 is provided with a function of emitting only selected single backward beam from the backward side. According to the constitution, although the semiconductor lasers are simultaneously operated, a number of pieces of beam are not incident on the optical monitor 45 in one time but the operational state of the respective semiconductor laser 14 can be monitored with time-division. This is because generally, the change in the operational state of the semiconductor laser 14 is slow and needs not to be monitored always.

The output and wavelength monitor of the backward beam used in the above-described embodiment may be small-sized to be capable of being incorporated in the module and is not limited to one kind.

(Embodiment 7)

Figure 15:
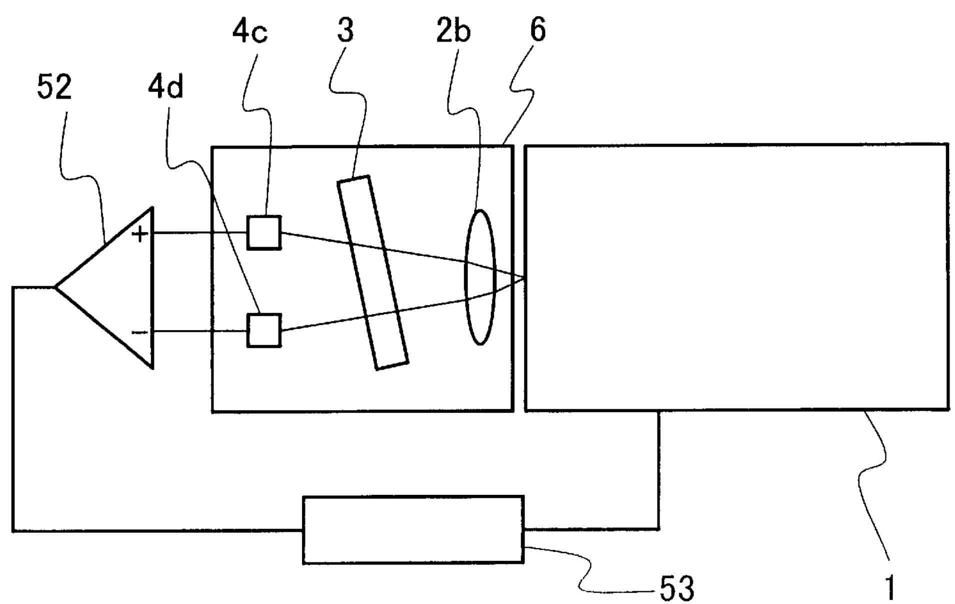
FIG. 15 is a schematic diagram showing a laser control system in an optical transmitter according to other embodiment (Embodiment 7) of the present invention.

FIG. 15 is a schematic view showing a laser control system of an optical transmitter according to other embodiment (Embodiment 7) of the present invention. Embodiment 7 relates to a second type of optical monitor according to the present invention and is an example of using a technology disclosed in, for example, Japanese Patent Laid-open (Kokai) No. Hei 10-79723.

As shown by FIG. 15, the collimator lens *2b*, the etalon filter 3 and photo detectors *4c* and *4d* are arranged on the backward end side of the semiconductor chip 1. The respective optical parts are mounted on the subassembly substrate 6. Further, detected signals of the photo detectors *4c* and *4d* are inputted to a plus terminal (+) or a minus terminal (−) of an operational amplifier 52. Further, an output signal of the operational amplifier 52 is inputted to a laser controller 53 and by an output therefrom, respective semiconductor lasers, not illustrated, of the semiconductor chip 1 are controlled to drive.

According to the example of Embodiment 7, by pertinently diverging incident beam by the collimator lens *2b* and inclining the etalon filter 3 relative to the optical axis, wavelength transparent characteristics slightly differ with regard to the photo detector *4c* and the photo detector *4d* and therefore, by comparing outputs of the two photo detectors *4c* and *4d*, it is determined whether the incident beam is deviated from predetermined wavelength. The method is featured in that a number of parts is small and the method is inexpensive.

(Embodiment 8)

Figure 16:
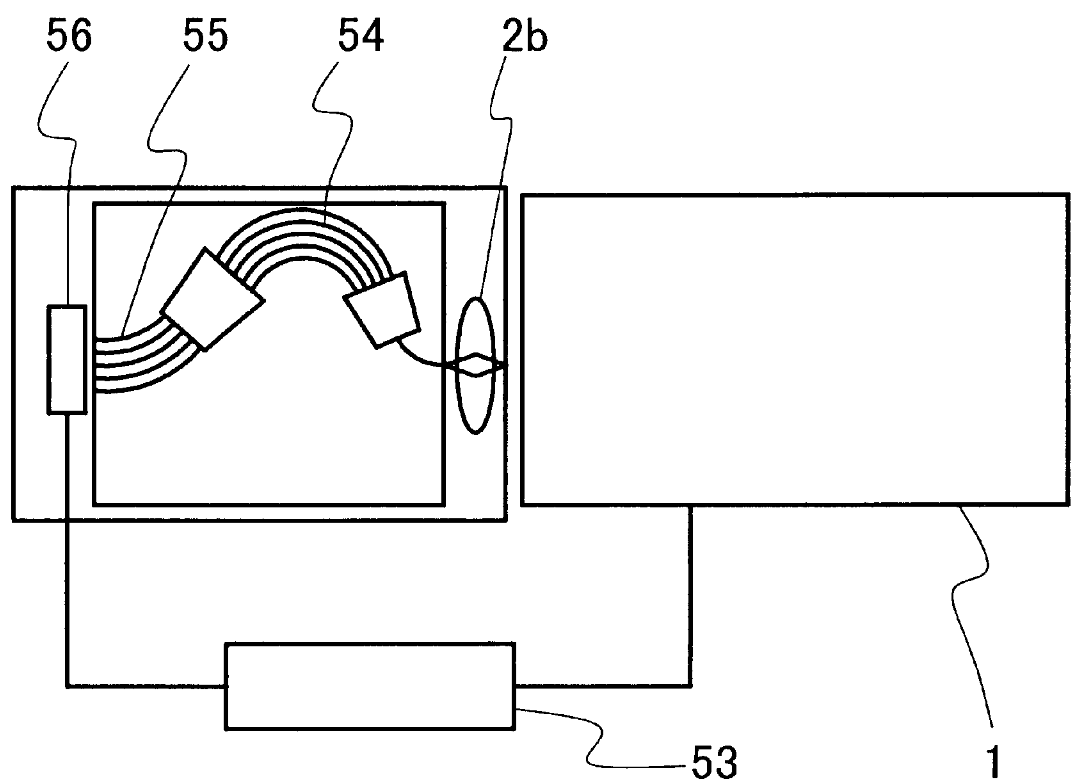
FIG. 16 is a schematic diagram showing a laser control system in an optical transmitter according to other embodiment (Embodiment 8) of the present invention.

FIG. 16 is a schematic view showing a laser control system in an optical transmitter according to other embodiment (Embodiment 8) of the present invention. Embodiment 8 relates to a third type of optical monitor according to the present invention and is an example of an optical monitor using an optical element referred to as an arrayed waveguide grating. According thereto, there is provided a characteristic in which when beam (laser beam) is passed through a group 54 of a number of optical waveguides having different wavelengths, an interference effect is produced at an output thereof and outputs of output optical waveguides 55 differ in accordance with wavelengths. Therefore, by individually detecting the respective outputs of the output optical waveguides 55 by a group 56 of light receiving elements and comparing outputs of contiguous ones of the light receiving elements (photo detectors), a deviation of beam inputted through the collimator lens 2*b* from the grid wavelength can be detected. In this case, there is achieved an advantage capable of simultaneously inputting the plurality of pieces of beam to monitors.

Output signals of the light receiving elements group 56 are processed by the laser controller 53 and are fed back as control signals for changing the wavelengths of the semiconductor lasers such that deviations from predetermined wavelengths are eliminated.

As a method of changing the wavelength, there is used a publicly-known method such as a method of changing operational temperature of the semiconductor laser as in Embodiment 1 or a method of changing the refractive index of the semiconductor by voltage.

Figure 17:
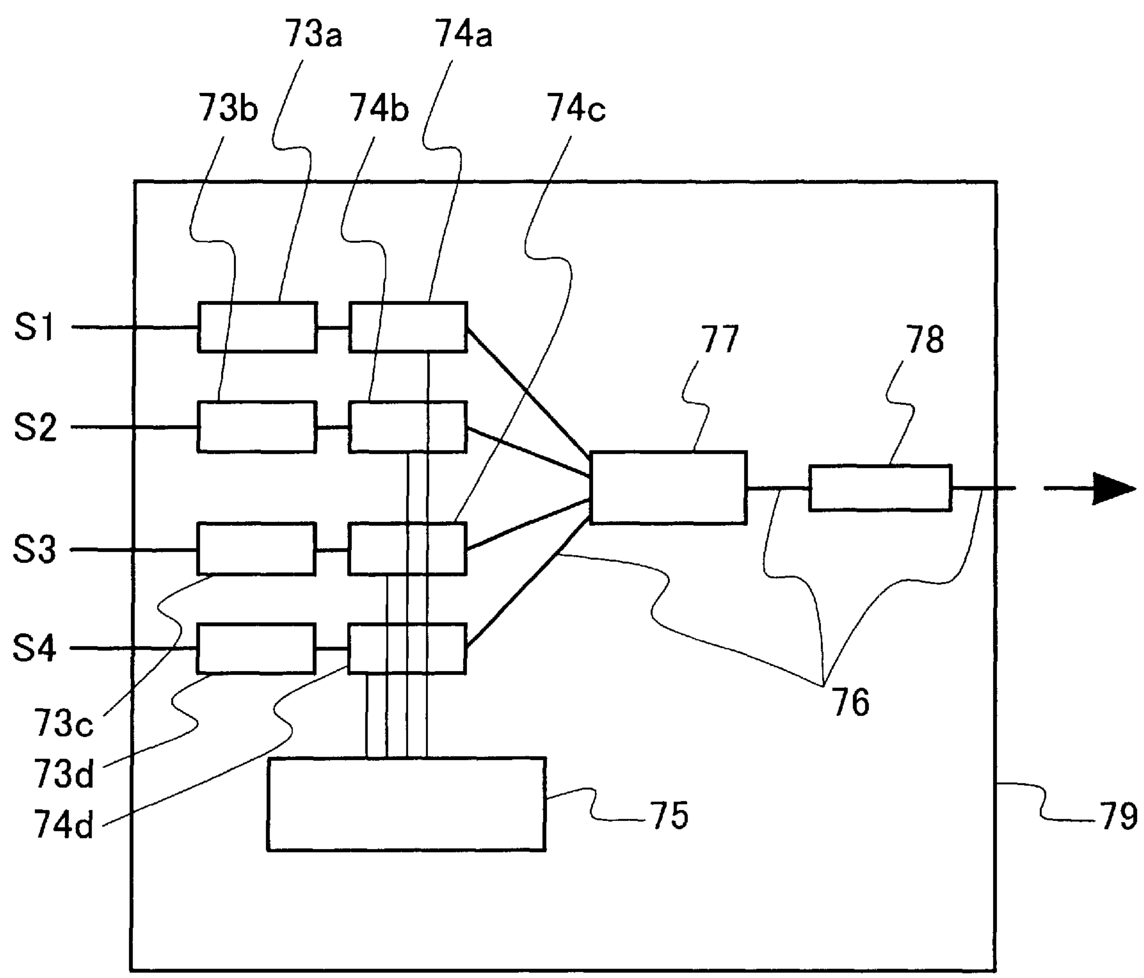
FIG. 17 is a block diagram showing an outline of a constitution of a wavelength multiplexing optical communicator according to the present invention.
Figure 18:
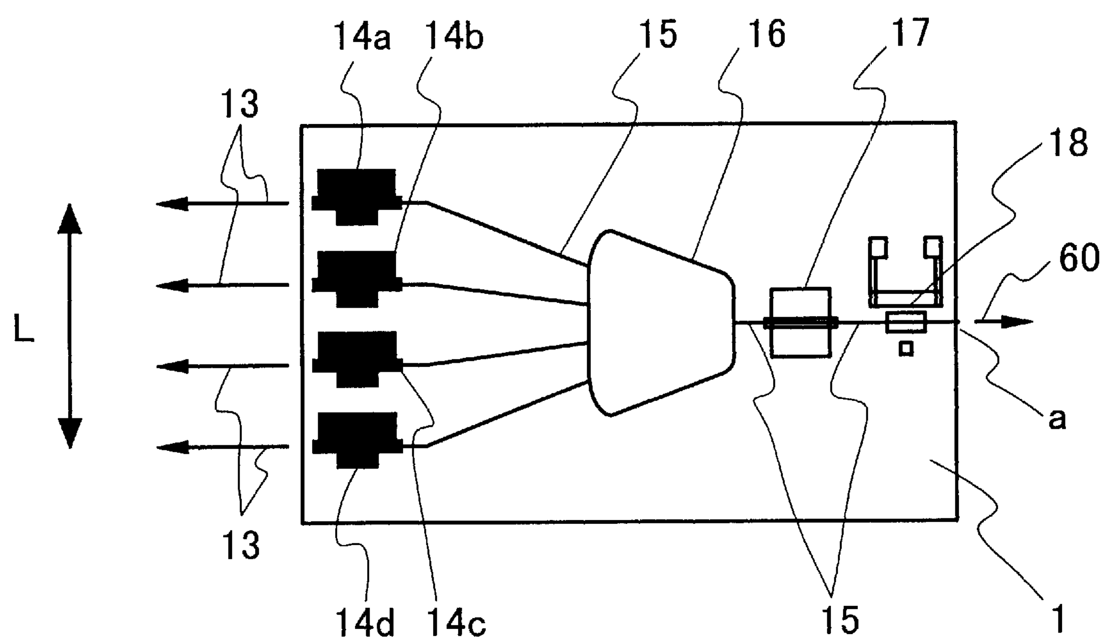
FIG. 18 is a schematic plane view of an optical integrated device investigated by the inventors prior to the present invention.

An explanation will be given here of an outline of a constitution of a wavelength multiplexing optical transmitter using the semiconductor laser module according to the present invention in reference to FIG. 17. FIG. 17 shows an example of four wavelengths multiplexing optical transmitter.

According to the optical transmitter, four routes of electric signals S1 through S4 having information are inputted to respective modulator drivers 73*a* through 73*d* and the respective drivers drive modulators incorporated in semiconductor laser modules 74*a* through 74*d*. The respective semiconductor laser modules 74*a* through 74*d* are controlled to provide predetermined wavelengths and outputs by a controller 75, and pieces of beam modulated by the respective signals and having wavelengths different from each other, are guided to a multiplexer 77 by optical fibers 76 and amplified by a fiber amplifier 78 and transmitted to remote locations.

The respective module is incorporated with a plurality of semiconductor lasers and a laser emitting beam by the beam emitting wavelength is selected by the controller 75. Further, with regard to whether the beam is emitted correctly by a predetermined wavelength, signals of an optical monitor and a thermistor incorporated in the module are transmitted to the controller 75, a Pertier element incorporated in the respective module is controlled by the controller 75 and temperature of the semiconductor laser is adjusted to constitute the predetermined wavelength. Details of the control mechanism have been described in reference to FIG. 4. The semiconductor laser modules, the controller, the drivers and the fiber multiplexer are provided in a transmitter package 79.

In the case of the optical transmitter using the semiconductor laser modules according to the embodiment, the wavelength monitors are incorporated in the respective modules, the apparatus constitution becomes compact and further, whereas in conventional optical transmitter, it is necessary to use respectively different semiconductor laser modules fabricated in accordance with previously determined wavelengths in the plurality of semiconductor laser modules in the optical transmitter, the same semiconductor laser modules can be used according to the embodiment.

This is because the plurality of semiconductor lasers are incorporated in the respective module, different wavelengths can be emitted in accordance with selection of the semiconductor laser and accordingly, one kind of the prepared semiconductor laser module may be used. Further, one kind of a spare semiconductor laser module prepared in consideration of failure may be used.

Therefore, there is achieved an advantage of capable of saving fabrication and maintenance cost of the optical transmitter. According to the embodiment, it goes without saying that any type of incorporated optical monitor can be selected, beam for providing a control signal may be only backward beam or both of backward beam and forward beam may be used.

A specific explanation has been given of the present invention provided by the inventors based on the embodiments as described above. The present invention is not limited to the above-described embodiments but may naturally be modified variously within a range not deviated from gist thereof.

A simple explanation will be given of effects provided by representative aspects of the present invention disclosed in the present application as follows.

(1) There can be provided an optical integrated device, a semiconductor laser module and an optical transmitter capable of highly accurately monitoring optical outputs of a plurality of respective semiconductor lasers arranged and integrated in parallel monolithically on a semiconductor substrate.

(2) There can be provided an optical integrated device, a semiconductor laser module and an optical transmitter capable of highly accurately monitoring optical outputs of the plurality of respective semiconductor lasers arranged and integrated in parallel monolithically on a semiconductor substrate without attenuation.

(3) There can be provided an optical integrated device emitting backward beam of a plurality of respective semiconductor lasers arranged and integrated in parallel monolithically on a semiconductor substrate from an extremely small area at a backward end of the semiconductor substrate (semiconductor chip).

(4) According to the present invention, there can be realized an optical monitor integrated type semiconductor laser module including a chip integrated with a plurality of semiconductor lasers and the small-sized wavelength monitor in an identical package and industrial interest starting from an optical communication system is enormous.

It is further understood by those skilled in the art that the foregoing description is a preferred embodiment of the disclosed device and that various changes and modifications may be made in the invention without departing from the spirit and scope thereof.

What is claimed is:

1. An optical integrated device comprising:

a semiconductor substrate;

a plurality of semiconductor lasers formed in parallel monolithically on the semiconductor substrate;

forward optical waveguides and backward optical waveguides formed monolithically on the semiconductor substrate for guiding a forward beam and a backward beam of each of the plurality of semiconductor lasers to a forward end and a backward end of the semiconductor substrate;

a multiplexer for integrating the backward optical waveguides into a single piece of a backward optical waveguide;

wherein a single backward beam is emitted from the backward end of the semiconductor substrate; and further comprising an optical amplifier for amplifying the backward beam which has passed through the multiplexer, the optical amplifier being provided on the semiconductor substrate.

2. An optical integrated device comprising:

a semiconductor substrate;

a plurality of semiconductor lasers formed in parallel monolithically on the semiconductor substrate; and forward optical waveguides and backward optical waveguides formed monolithically on the semiconductor substrate for guiding a forward beam and a backward beam of each of the plurality of semiconductor lasers to a forward end and a backward end of the semiconductor substrate;

wherein the backward optical waveguides at the backward end of the semiconductor substrate are gathered and arranged within a predetermined range; and wherein the optical integrated device further comprises, on the semiconductor substrate:

a multiplexer for integrating the forward optical waveguides into a single piece of a forward optical waveguide;

an amplifier optically connected to the multiplexer for amplifying the forward beam; and a modulator optically connected to the amplifier for modulating the forward beam.

3. An optical integrated device comprising:

a semiconductor substrate;

a plurality of semiconductor lasers formed in parallel monolithically on the semiconductor substrate;

forward optical waveguides and backward optical waveguides formed monolithically on the semiconductor substrate for guiding a forward beam and a backward beam of each of the plurality of semiconductor lasers to a forward end and a backward end of the semiconductor substrate;

a multiplexer for integrating the backward optical waveguides into a single piece of a backward optical waveguide;

wherein a single backward beam is emitted from the backward end of the semiconductor substrate; and further comprising, on the semiconductor substrate:

a multiplexer for integrating the forward optical waveguides into a single piece of forward optical waveguide;

an amplifier optically connected to the multiplexer for amplifying the forward beam; and a modulator optically connected to the amplifier for modulating the forward beam.

4. An optical integrated device comprising:

a semiconductor substrate;

a plurality of semiconductor lasers formed in parallel monolithically on the semiconductor substrate;

forward optical waveguides and backward optical waveguides formed monolithically on the semiconductor substrate for guiding a forward beam and a backward beam of each of the plurality of semiconductor lasers to a forward end and a backward end of the semiconductor substrate;

a multiplexer for integrating the forward optical waveguides into a single piece of a forward optical waveguide;

a multiplexer for integrating the backward optical waveguides into a single piece of a backward optical waveguide;

modulators optically connected to and arranged at middle portions of the forward optical waveguides for modulating the forward beam of each of the plurality of semiconductor lasers; and optical gates optically connected to and arranged at middle portions of the backward optical waveguides for controllably transmitting and blocking the backward beam of each of the plurality of semiconductor lasers;

wherein a single forward beam is emitted from the forward end of the semiconductor substrate; and wherein a single backward beam is emitted from the backward end of the semiconductor substrate.

5. An optical integrated device according to claim 4, further comprising:

an amplifier, formed monolithically on the semiconductor substrate, for amplifying the forward beam which has passed through the multiplexer; and an amplifier, formed monolithically on the semiconductor substrate, for amplifying the backward beam which has passed through the multiplexer.

6. A semiconductor laser module comprising:

a package;

a plurality of external electrode terminals extending inside and outside of the package;

an optical integrated device, a plurality of optical elements, a photo detector, and a thermistor provided in the package, some of which are predetermined parts;

connecting means for electrically connecting electrodes of the predetermined parts to the external electrode terminals; and an optical fiber whose inner end faces a laser emitting face at a forward end of the optical integrated device and whose outer end extends outside of the package;

wherein the photo detector receives a backward beam emitted from a backward end of the optical integrated device; and wherein the optical integrated device is an optical integrated device according to claim 4.

7. An optical transmitter comprising a semiconductor laser module according to claim 6 mounted in the optical transmitter;

wherein the semiconductor lasers in the semiconductor laser module are controlled based on information obtained by detecting the backward beam, and temperature information detected by the thermistor.

8. An optical transmitter comprising a semiconductor laser module according to claim 6 mounted in the optical transmitter;

wherein the semiconductor lasers in the semiconductor laser module are controlled based on information obtained by detecting the backward beam and the forward beam, and temperature information detected by the thermistor.

9. A semiconductor laser module comprising:

a package;

a plurality of external electrode terminals extending inside and outside of the package;

an optical integrated device, a plurality of optical elements, a photo detector, and a thermistor provided in the package, some of which are predetermined parts;

connecting means for electrically connecting electrodes of the predetermined parts to the external electrode terminals; and an optical fiber whose inner end faces a laser emitting face at a forward end of the optical integrated device and whose outer end extends outside of the package;

wherein the photo detector receives a backward beam emitted from a backward end of the optical integrated device; and wherein the optical integrated device includes:

a semiconductor substrate;

a plurality of semiconductor lasers formed in parallel monolithically on the semiconductor substrate; and forward optical waveguides and backward optical waveguides formed monolithically on the semiconductor substrate for guiding a forward beam and a backward beam of each of the plurality of semiconductor lasers to a forward end and a backward end of the semiconductor substrate;

wherein the backward optical waveguides at the backward end of the semiconductor substrate are gathered and arranged within a predetermined range.

10. An optical transmitter comprising a semiconductor laser module according to claim 9 mounted in the optical transmitter;

wherein the semiconductor lasers in the semiconductor laser module are controlled based on information obtained by detecting the backward beam, and temperature information detected by the thermistor.

11. An optical transmitter comprising a semiconductor laser module according to claim 9 mounted in the optical transmitter;

wherein the semiconductor lasers in the semiconductor laser module are controlled based on information obtained by detecting the backward beam and the forward beam, and temperature information detected by the thermistor.

12. A semiconductor laser module comprising:

a package;

a plurality of external electrode terminals extending inside and outside of the package;

an optical integrated device, a plurality of optical elements, a photo detector, and a thermistor provided in the package, some of which are predetermined parts;

connecting means for electrically connecting electrodes of the predetermined parts to the external electrode terminals; and an optical fiber whose inner end faces a laser emitting face at a forward end of the optical integrated device and whose outer end extends outside of the package;

wherein the photo detector receives a backward beam emitted from a backward end of the optical integrated device; and wherein the optical integrated device is an optical integrated device comprising:

a semiconductor substrate;

a plurality of semiconductor lasers formed in parallel monolithically on the semiconductor substrate;

forward optical waveguides and backward optical waveguides formed monolithically on the semiconductor substrate for guiding a forward beam and a backward beam of each of the plurality of semiconductor lasers to a forward end and a backward end of the semiconductor substrate; and a multiplexer for integrating the backward optical waveguides into a single piece of a backward optical waveguide;

wherein a single backward beam is emitted from the backward end of the semiconductor substrate.

13. An optical transmitter comprising a semiconductor laser module according to claim 12 mounted in the optical transmitter;

wherein the semiconductor lasers in the semiconductor laser module are controlled based on information obtained by detecting the backward beam, and temperature information detected by the thermistor.

14. An optical transmitter comprising a semiconductor laser module according to claim 12 mounted in the optical transmitter;

wherein the semiconductor lasers in the semiconductor laser module are controlled based on information obtained by detecting the backward beam and the forward beam, and temperature information detected by the thermistor.

15. An optical integrated device comprising:

a semiconductor substrate;

a plurality of semiconductor lasers formed in parallel monolithically on the semiconductor substrate;

forward optical waveguides and backward optical waveguides formed monolithically on the semiconductor substrate for guiding a forward beam and a backward beam of each of the plurality of semiconductor lasers to a forward end and a backward end of the semiconductor substrate;

wherein the backward optical waveguides at the backward end of the semiconductor substrate are gathered and arranged within a first range which is narrower than a second range within which the backward optical waveguides are arranged where the backyard optical waveguides are connected to the semiconductor lasers; and further comprising, on the semiconductor substrate:

a multiplexer for integrating the forward optical waveguides into a single piece of a forward optical waveguide;

an amplifier optically connected to the multiplexer for amplifying the forward beam; and a modulator optically connected to the amplifier for modulating the forward beam.

16. A semiconductor laser module comprising:

a package;

a plurality of external electrode terminals extending inside and outside of the package;

an optical integrated device, a plurality of optical elements, a photo detector, and a thermistor provided in the package, and some of which are predetermined parts;

connecting means for electrically connecting electrodes of the predetermined parts to the external electrode terminals; and an optical fiber whose inner end faces a laser emitting face at a forward end of the optical integrated device and whose outer end extends outside of the package;

wherein the photo detector receives a backward beam emitted from a backward end of the optical integrated device; and wherein the optical integrated device is an optical integrated device comprising:

a semiconductor substrate;

a plurality of semiconductor lasers formed in parallel monolithically on the semiconductor substrate; and forward optical waveguides and backward optical waveguides formed monolithically on the semiconductor substrate for guiding a forward beam and a backward beam of each of the plurality of semiconductor lasers to a forward end and a backward end of the semiconductor substrate;

wherein the backward optical waveguides at the backward end of the semiconductor substrate are gathered and arranged within a first range which is narrower than a second range within which the backward optical waveguides are arranged where the backyard optical waveguides are connected to the semiconductor lasers.

17. An optical transmitter comprising a semiconductor laser module according to claim 16 mounted in the optical transmitter;

wherein the semiconductor lasers in the semiconductor laser module are controlled based on information obtained by detecting the backward beam, and temperature information detected by the thermistor.

18. An optical transmitter comprising a semiconductor laser module according to claim 16 mounted in the optical transmitter;

wherein the semiconductor lasers in the semiconductor laser module are controlled based on information obtained by detecting the backward beam and the forward beam, and temperature information detected by the thermistor.

* * * * *